United States Patent [19]

Motarjemi

[11] Patent Number: 5,036,488
[45] Date of Patent: Jul. 30, 1991

[54] AUTOMATIC PROGRAMMING AND ERASING DEVICE FOR ELECTRICALLY ERASABLE PROGRAMMABLE READ-ONLY MEMORIES

[76] Inventor: David Motarjemi, Via Napoli, Deerfield, Fla. 33442

[21] Appl. No.: 328,549

[22] Filed: Mar. 24, 1989

[51] Int. Cl.⁵ .......... G11C 7/00; G11C 13/00
[52] U.S. Cl. ............ 365/52; 365/218; 365/201; 357/74; 174/50; 361/391; 369/32; 369/100
[58] Field of Search .......... 365/52, 218, 201; 360/66; 369/100, 24, 32; 357/74; 174/50; 361/391, 392, 331

[56] References Cited

U.S. PATENT DOCUMENTS

| | | | |
|---|---|---|---|
| 3,984,822 | 10/1976 | Simko et al. | 365/185 |
| 4,008,945 | 2/1977 | Schere | 350/1 X |
| 4,161,039 | 7/1979 | Rössler | 365/185 X |
| 4,326,214 | 4/1982 | Trueblood | 357/74 X |
| 4,479,203 | 10/1984 | Kuo | 365/218 X |
| 4,503,524 | 3/1985 | McElroy | 365/218 X |
| 4,578,751 | 3/1986 | Erwin | 365/218 |
| 4,727,221 | 2/1988 | Saitou et al. | 174/52 X |

FOREIGN PATENT DOCUMENTS

| | | | |
|---|---|---|---|
| 55-87387 | 7/1980 | Japan | 365/218 |
| 56-18471 | 2/1981 | Japan | 365/218 |
| 58-77095 | 5/1983 | Japan | 365/218 |
| 58-80193 | 5/1983 | Japan | 365/218 |
| 61-150196 | 7/1986 | Japan | 365/218 |
| 61-292294 | 12/1986 | Japan | 365/218 |
| 63-31094 | 2/1988 | Japan | 365/218 |
| 63-97939 | 4/1988 | Japan | 365/218 |
| 1347096 | 10/1987 | U.S.S.R. | 365/218 |
| 8202274 | 7/1982 | World Int. Prop. O. | 365/218 |

OTHER PUBLICATIONS

Technical Digest, No. 62, Apr. 1981, Wester Electric, p. 21, "Ultraviolet Light EPROM", Eraser by G. J. Turner.
Newark Catalog No. 109, Newark Electronics, Jan. 14, 88, pp. 86–87.

*Primary Examiner*—Aristotelis M. Psitos
*Assistant Examiner*—Alfonso Garcia
*Attorney, Agent, or Firm*—Herbert L. Lerner; Laurence A. Greenberg

[57] ABSTRACT

An automatic erasing and programming device for erasable programmable read-only memory chips includes a housing having a working surface with a plurality of receptacles for receiving the memory chips. A source of ultraviolet light is provide for erasing the memory chips by ultraviolet light irradiation. An ultraviolet light source for turning it on and off. A device for determining completion of erasure of all old data in the memory chips is connected to the light source control device for turning it off when all old data are erased. A programming device for programming the memory chips with new data is responsive to the erasure determining device for starting programming with the new data when the old data have been erased.

8 Claims, 3 Drawing Sheets

An automatic programming and erasing device for electrically erasable programmable read-only memories.

AUTOMATIC PROGRAMMING AND ERASING DEVICE FOR ELECTRICALLY ERASABLE PROGRAMMABLE READ-ONLY MEMORIES

The invention relates to devices for automatically erasing and programming electrically erasable programmable read-only memories of the type, known as EEPROMS, OR E$^2$PROMS, that are erasable by irradiation with ultraviolet light.

BACKGROUND OF THE INVENTION

The erasing process of memories of this type typically takes from 10 to 30 minutes of ultraviolet irradiation. The exposure time is widely variable even for ROMs taken from the same production runs. According to the known art, a separate erasing device is used for mounting the ROM chips while they are being exposed to the UV radiation. After radiation the chips are taken to a programming device connected to a control circuit, usually a computer, which loads the new data into the ROM chips.

The process is slow and requires much handling of the chips with resulting loss of components, breakage, mistakes and exposure to static voltage damage to the chips.

The instant invention overcomes the problem of programming E$^2$ROM chips according to the known erasing and reprogramming method and apparatus.

SUMMARY OF THE INVENTION

The invention provides apparatus and a method for erasing and programming UV-erasable ROMs. The apparatus includes a housing or enclosure which has: a working surface having a plurality of receptacles for the ROM chips; a source of UV-light for erasing old data stored in the ROMS by means of UV-light irradiation: light source control means connected to the UV-light source for turning it on and off; suitable means in the form of a data reading circuit for determining when all of the old data are completely erased from all of the ROM chips, which are connected to the UV-light source for turning it off when the erasure is completed; and programming means for programming the ROMs with new data when erasure is completed.

According to a further feature the programming device has the UV-light source built into a cover for the housing, which is connected to the housing by hinges or by means of a drawer slide, and has a push key switch coupled to the UV-light irradiation control means for automatically turning on the light when the cover is closed, and turning off the light when the cover is open.

In accordance with a still further feature, the ROM receptacles have built-in automatic locking means for locking the ROMs securely in the receptacles during erasure and writing of new data, and release means for again releasing the ROMs when the writing is completed. The locking and release means are advantageously connected to the aforesaid push key.

According to still another feature, the programming device has addressing means for addressing each ROM and each word in the ROM and reading circuitry connected to the addressing means so that each ROM can be read during UV-light irradiation to determine when each ROM is completely erased.

In accordance with still another feature, the device is connected to a computer which controls the ROM addressing, the UV-light source, the reading of the old data and the writing of the new data.

Other features which are considered as characteristic for the invention are set forth in the appended claims.

Although the invention is illustrated and described herein as embodied in an automatic programming and erasing device for electrically erasable programmable read-only memories, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings:

DESCRIPTION OF THE PREFERRED EMBODIMENTS

Figure 1:
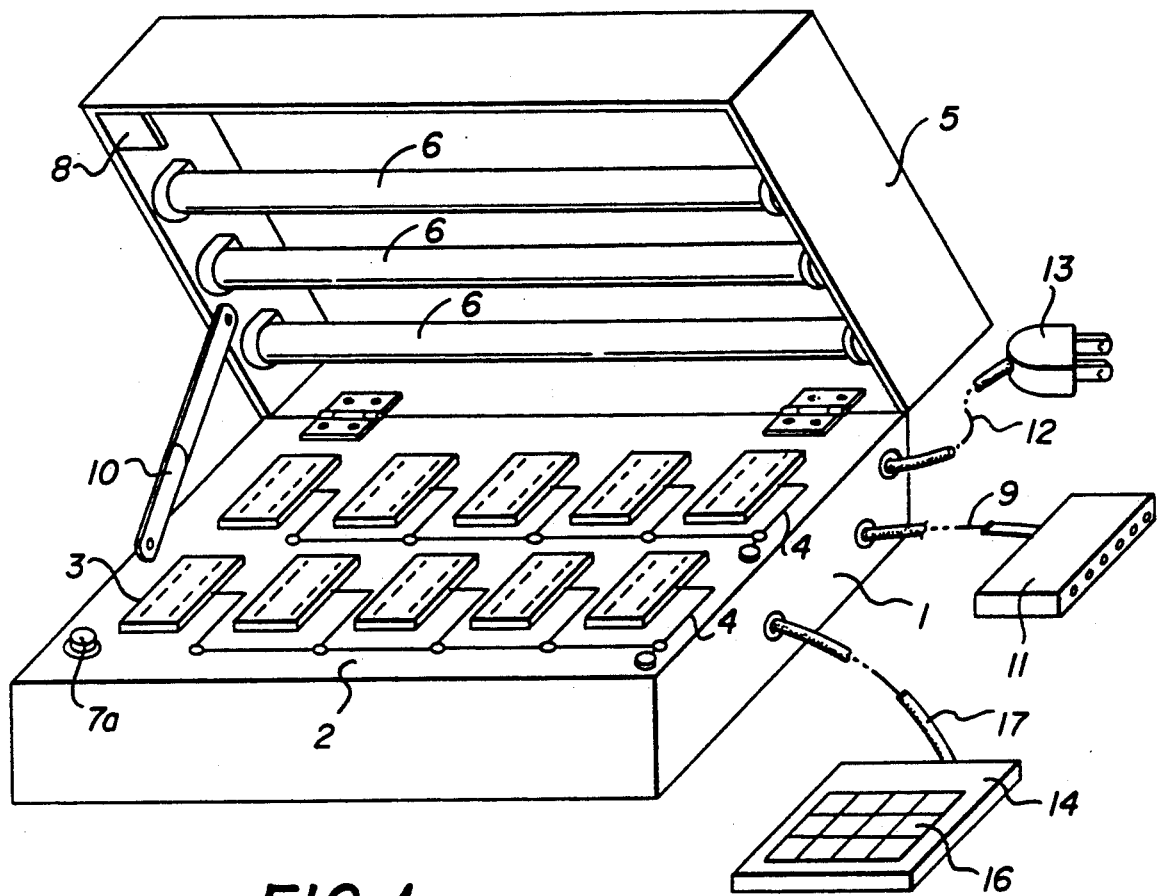
FIG. 1 is a perspective view of the invention showing the device with open cover.

FIG. 1 shows an automatic erasing and programming device according to the invention. It includes a housing 1 having a working surface 2, which has a plurality of receptacles 3 for receiving programmable read-only memory chips to be erased and subsequently programmed with new data. Each receptacle is of a well-known type that has a chip locking and release feature that is actuated by a lever 4 extending from the receptacle and serves to lock the chip pins firmly into pin terminals of the receptacle after the chip is inserted, and to release the pins when the chips are to be removed. A strut 10 serves to support the cover 5 in its open position.

A cover 5 has installed therein a set of UV-light sources, advantageously in the form of light tubes which can be placed immediately above the chips when they are to be erased. In FIG. 1, the cover is shown attached pivotally by means of hinges 7 to an edge of the housing 1. A push key 7a disposed in the working surface 2 serves to control the on-off function of the UV-lights 6 in series with a UV-light control circuit described in more detail below. The push key 7a, as actuated by a plate 8 in the cover closes a circuit to the UV-lights 6 whenever the cover is closed, and insures that the lights are off, when the cover is opened, so that harmful UV-light cannot escape from the device when the cover is open.

The housing 1 contains electronic circuits that control the various electrical functions of the programming device by means of a computer, not shown, which is connected to the electronic circuits by a computer cable 9 with a suitable connector 11. Electrical power for the circuits is supplied via an AC-power card 12 with a plug 13. A control pad 14 has keys and light indicators 16 that serve to provide manual control of the electronic circuits, and is connected to the circuits by means of a cable 17.

Figure 2:
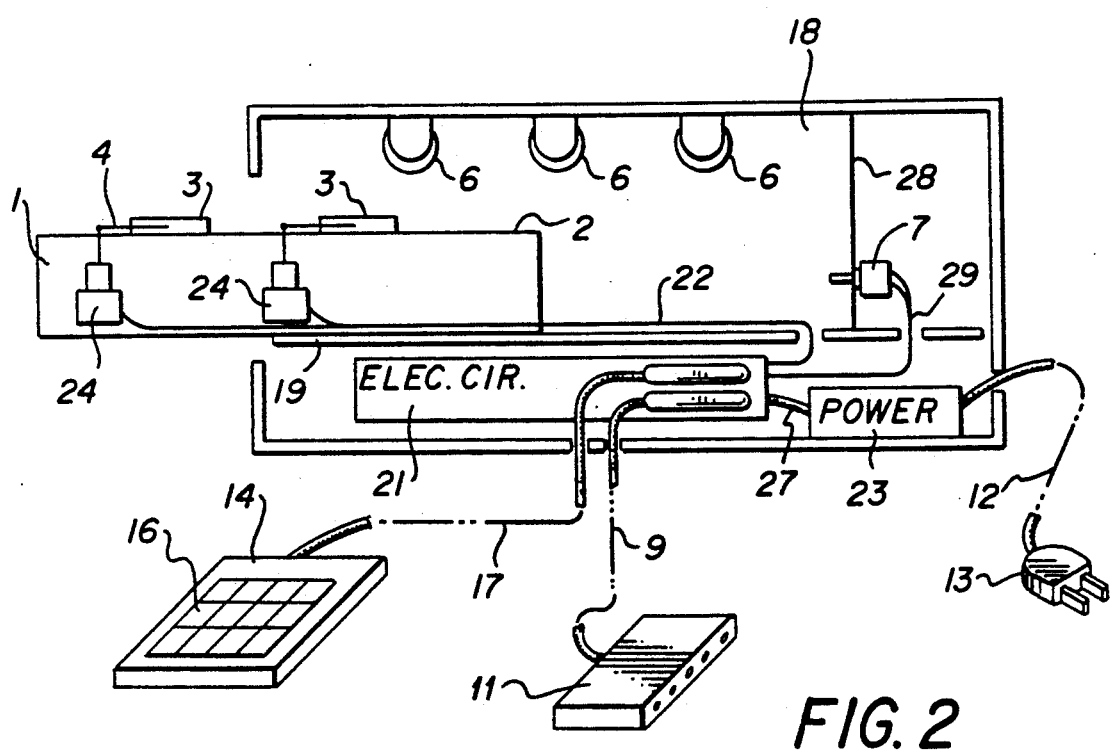
FIG. 2 is an elevational cross-sectional view of the invention with the wall broken away to show the interior construction with the chip receptacles mounted on a pull-out drawer.

FIG. 2 shows an enclosure 18 wherein the housing 1 can slide into the enclosure as a drawer on sliding rails 19. In this arrangement the UV-lights are disposed inside the enclosure immediately above the housing 1, when it is placed completely inside the enclosure 18. The pushkey 7a is in this case positioned behind the housing 1 such that it is actuated whenever the housing 1 is completely inserted into the enclosure 18.

In FIG. 2, the enclosure 18 and the housing 1 are shown with the facing walls removed so that the major internal parts can be seen. The bottom part of the enclosure contains an electronic circuit 21 which controls all the functions of the programming device, as described in more detail below. The electronic circuit 21 is connected via a flexible cable 22 to pin terminals of the receptacles 3 and to solenoids 24. The solenoids are connected, via linkage 26, to activating arms 4 of the receptacles 3, via cable 17 to control pad 14, via cable 9 and connector 11 to a computer 31 and via cable 27 to a power supply 23, which is in turn connected via a power cord 12 and plug 13 to ac-power.

A push key 7a is mounted on a back wall 28 and is operated by engagement with the housing 1 as it is pushed into the enclosure 18 and is connected via leads 29 to the electronic circuit 21 to control the on-off state of the UV-lights 6. The push key 7a may also serve to control the solenoids 24 for locking and releasing the pin terminals of the receptacles 3.

Figure 3:
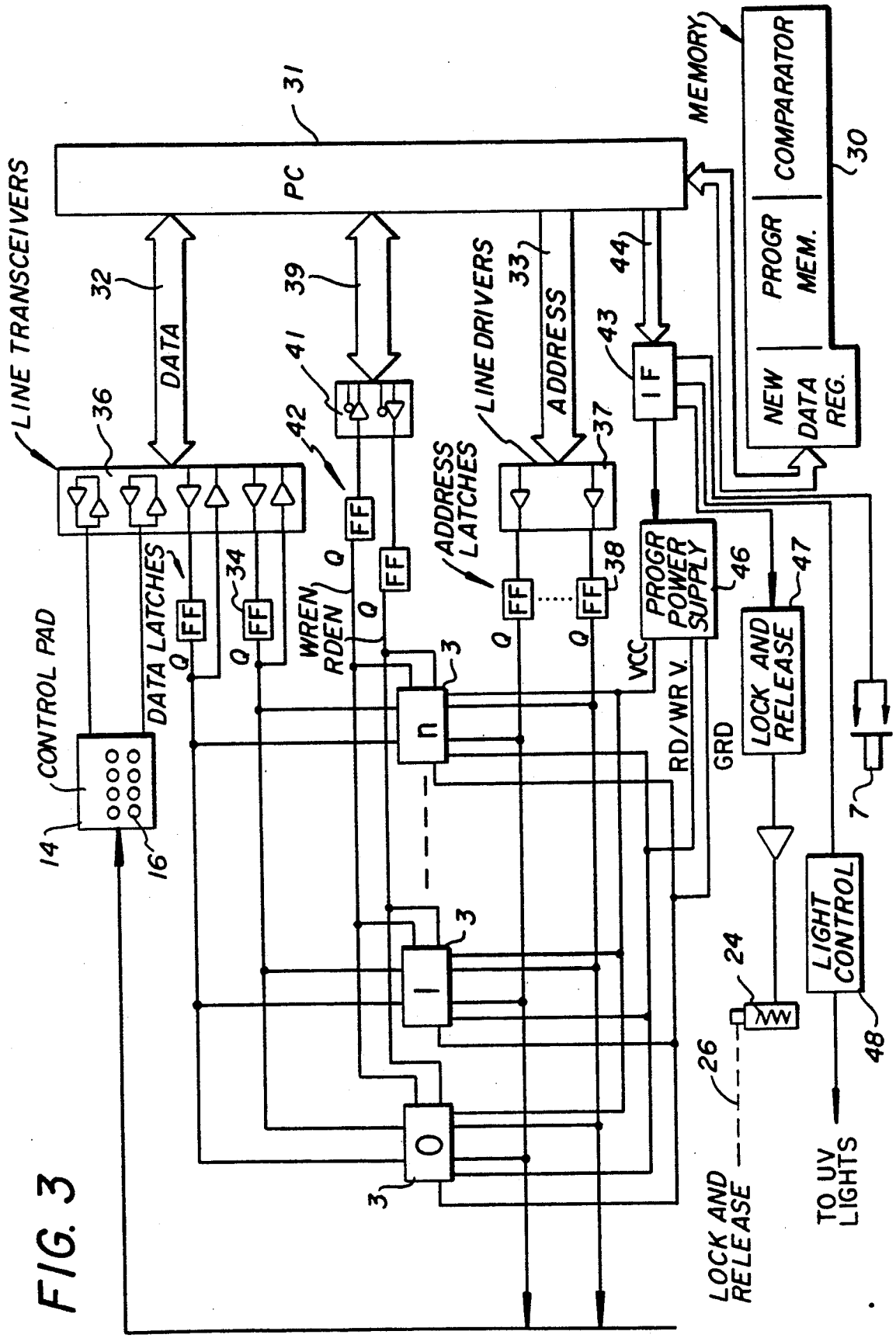
FIG. 3 is a circuit diagram of the invention, showing major circuit blocks.

FIG. 3 shows circuit details of the electronic circuit 21. A computer PC 31 is connection in conventional manner via a data bus 32 with bi-directional line transceivers 36, which in turn control a group of data latches 34. An address bus 33 is connected also in conventional manner with address line drivers 37, which control the on-off states of address latches 38. The data and address latches have outputs Q that are respectively connected to data and address pin terminals of the memory chip receptacles 3, numbered 0 - n, which serve to receive E$^2$PROMS to be erased and/or programmed in accordance with data and addresses furnished by the computer 31.

The erasing and programming of the E$^2$PROMS is controlled by a first control bus 39, transmitting control signals from the computer 31 to a control interface 41 having conventional line drivers connected to control latches 42, which in turn control the on-off state of respective write-enable and read-enable (WR EN, RD EN) leads connected to respective control pin terminals of the receptacles 3.

The control pad 14 with keys and lights 16 receives address information via the address latches 38 and data via the data latches 34 from the computer 31 and enables a manual operator to enter all necessary control commands and to receive usually all necessary control information for operation of the programming device, such as "start", "stop", "interrupt", "verify", "erase complete", or "programming complete" etc.

A second control bus 44 transmits control data from the computer 31 via control interface 43 to a programmable power supply 46 serving to supply a programmed read-write voltage to the memory receptacles 3, wherein the writing voltage is elevated above the read voltage, and to control a programmable "Lock and Release" interface 47, which is in turn controlling the "locked" or "released" state of the receptacles 3 via solenoids 24, being mechanically linked via linkage 26 with the locking levers 4 of the receptacles 3.

A light control circuit 48 includes a power control device with an output connected to the UV lights and an input connected to the control interface 43, which is in turn controlled by the push key 7a and the computer 31 via control bus 44.

The computer 31 is connected to a control memory 30 which contains control programs that perform the overall control of the programming and erasing device.

Figure 4:
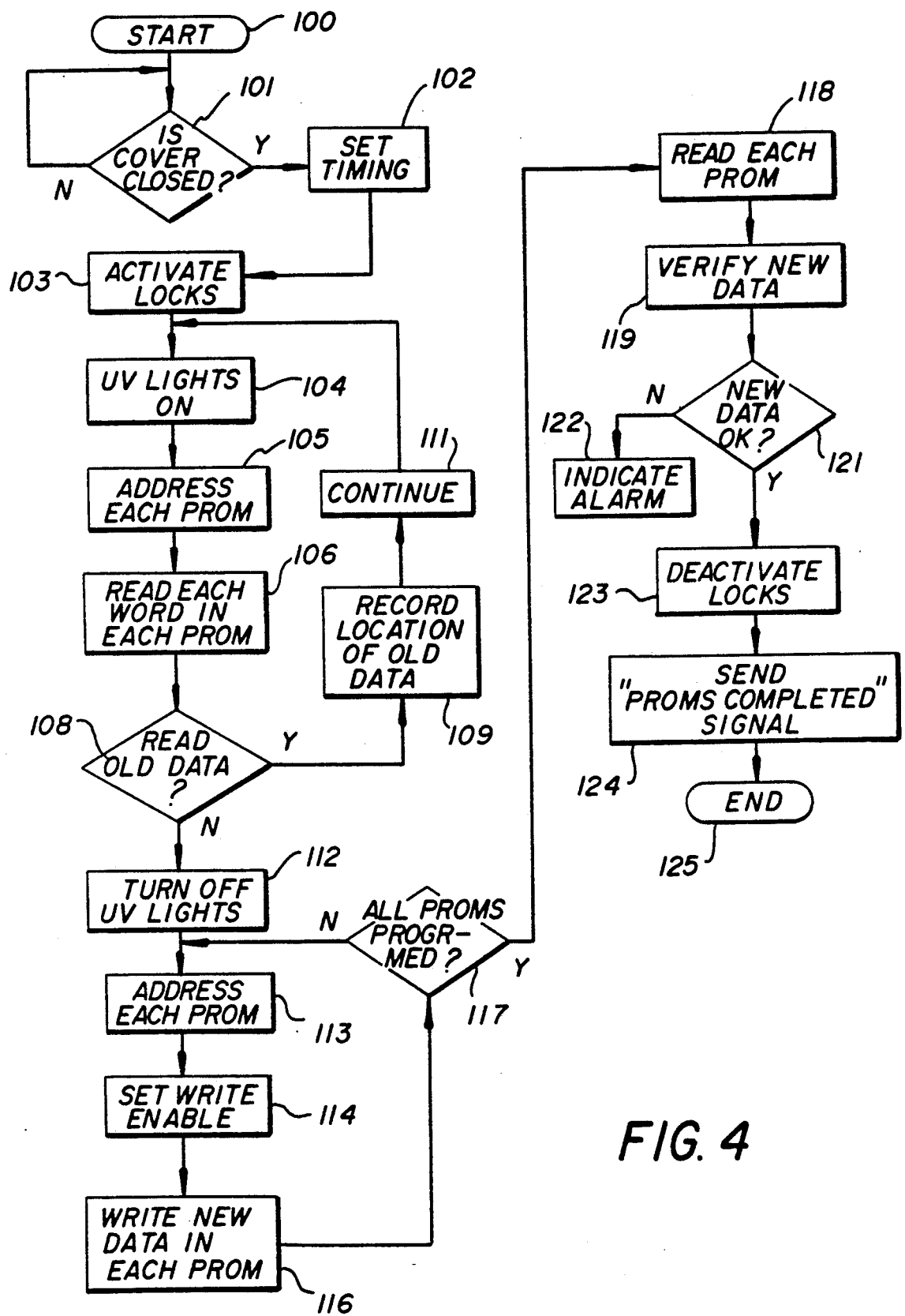
FIG. 4 is a flow chart of the invention showing the major method steps.

FIG. 4 is a flow-chart that shows a control algorithm with the major steps of the operation of the programming and erasing device. First a start command is entered in step 100, e.g. from the control pad 14. Step 101 determines if the cover is closed, or if the drawer 1 in FIG. 2 is completely inserted. If affirmative a timer is set in step 102 which represents a time lapse corresponding to the normally required time for erasing all E$^2$ROMS. The timing function is preferably performed by the computer 31. Next, in step 103, the receptacles 3 are locked by operating the solenoid(s) 24, and the UV lights are turned on in step 104. Next, an address scanning process is started in step 105, in which each E$^2$PROM is addressed one at the time, and each memory word and cell within each E$^2$PROM is addressed, and read-out. If a "ONE" is read-out in any E$^2$PROM, its location, i.e. address, is recorded in step 109, and a new address scan is initiated in step 111. Scanning and reading continues until no "one" is read out in any E$^2$PROM, or until the timing in step 102 has elapsed. When no "ONE" is read in any memory address, all E$^2$PROMS have been erased, and step 108 exits to step 112, which causes all UV-lights to be turned off, and programming of all E$^2$PROMS with new data stored in the computer 31 can begin. In case the time set in step 102 elapses before erasing is completed in step 108, an abnormal condition is present, which can be indicated and displayed on the keypad 14, so that human intervention can be made. Programming with new data starts in step 113, wherein each ROM is addressed in sequence, followed by a write-enable in step 114, and writing-in of new data in step 116. When all ROMS have been programmed, step 117 exits to step 118, wherein each ROM is addressed and read-out, and correctness of the read-out data is tested in steps 119 and 121. If incorrect, new data are determined in step 121, an alarm indication is issued in step 122. If all ROMS read proper new data, step 121 exists to step 123, which deactivates the locking of the receptacles 3, and in the next step 124 a "ROMS COMPLETED" signal is issued.

I claim:

1. Automatic erasing and programming device for erasable programmable read-only memory chips, comprising: a housing having a working surface with a plurality of receptacles for receiving the memory chips; a source of ultraviolet light for erasing the memory chips by ultraviolet light irradiation; ultraviolet light source control means connected to said ultraviolet light source for turning it on and off; means for determining completion of erasure of all old data in said memory chips connected to said light source control means for turning it off when all of said old data are erased; and programming means for programming said memory chips with new data, being responsive to said erasure determining means for starting programming with said new data when said old data have been erased; wherein said ultraviolet light source is disposed in a cover positionable proximal to said working surface; including automatic lock and release means for locking said memory chips into said receptacles and for releasing said memory chips from said receptacles; wherein said light source control means include a light source start output; and said automatic lock and release means are responsive to said light source start output for locking said receptacles upon start of said light source; and including a push key engageable by said cover connected to said automatic lock and release means for locking said receptacles when said cover is positioned proximal to said working surface and for releasing said receptacles when said cover is positioned apart from said working surface.

2. Programming device according to claim 1, wherein said cover is pivotally attached to said housing, the device including an interface circuit for interfacing to a computer, a control pad having keys connected to said interface circuit, and display elements connected to said control pad.

3. Programming device according to claim 1, wherein said working surface is slidably attached to said housing.

4. Device according to claim 1 having a programmable power supply.

5. Automatic erasing and programming device for erasable programmable read-only memory chips, comprising: a housing having a working surface with a plurality of receptacles for receiving the memory chips; a source of ultraviolet light for erasing the memory chips by ultraviolet light irradiation; ultraviolet light source control means connected to said ultraviolet light source for turning it on and off; means for determining completion of erasure of all old data in said memory chips connected to said light source control means for turning it off when all of said old data are erased; and programming means for programming said memory chips with new data, being responsive to said erasure determining means for starting programming with said new data when said old data have been erased, wherein said means for determining erasure of said old data include a reading circuit, a chip addressing circuit, a word addressing circuit, and a presence of data detector having a data present/absent output connected to said light source control means for turning it off in response to one of said old data being detected, wherein said programming means include a further data register, having a further data output, for storing said new data, a chip addressing circuit, a word addressing circuit, a write input for receiving a write voltage input, said write input being connectable to each memory word in response to said chip addressing circuit and said word addressing circuit for writing said new data from said data register into said memory chips, a comparator circuit having a first comparator input connected to said data present/absent output and a second comparator input connected to said further data output and a comparator output registering an active state when said first and second comparator inputs are receiving equal states, and an error register connected to said comparator output.

6. Programming device according to claim 5 including a computer, a memory for storing control programs connected to said computer, computer input-output means connected to said ultraviolet light source control means, said completion of erasure determining means, said programming means, and said comparator means for controlling said programming device.

7. Method of automatically erasing and programming erasable and programmable memory chips with an automatic erasing and programming device comprising the steps of: irradiating the memory chips with an ultraviolet light source in the automatic erasing and programming device proximal to the memory chips; controlling the ultraviolet light source by means of irradiation control means in the automatic erasing and programming device; periodically addressing and reading said memory chips to determine erasure of all old data stored in said chips using addressing and reading means in the automatic erasing and programming device, while storing the memory chips in the device until completion of erasing and writing of data; upon determination of erasure of all old data turning off the ultraviolet light source with the irradiation control means; addressing each of said memory chips with the addressing means and writing with write means in the automatic erasing and programming device new data into the chips; and upon completion of writing new data with the write means, issuing with the automatic erasing and programming device a signal announcing completion of erasing and writing data.

8. Method according to claim 7, further comprising the steps of automatically locking the chips onto receptacles in the automatic erasing and programming device by locking means before turning on the ultraviolet light source with the irradiation control means; and deactivating the locking means after completion of the writing of the new data.

* * * * *